United States Patent
Kamada et al.

(10) Patent No.: US 9,478,410 B2
(45) Date of Patent: Oct. 25, 2016

(54) METHOD OF FORMING NITRIDE FILM WITH PLASMA

(71) Applicant: Tokyo Electron Limited, Tokyo (JP)

(72) Inventors: Toyohiro Kamada, Yamanashi (JP); Noriaki Fukiage, Miyagi (JP); Takayuki Karakawa, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/967,751

(22) Filed: Dec. 14, 2015

(65) Prior Publication Data

US 2016/0172183 A1    Jun. 16, 2016

(30) Foreign Application Priority Data

Dec. 15, 2014  (JP) .................................. 2014-253494

(51) Int. Cl.
*H01L 21/36* (2006.01)
*H01L 21/02* (2006.01)

(52) U.S. Cl.
CPC ..... *H01L 21/0217* (2013.01); *H01L 21/02211* (2013.01); *H01L 21/02274* (2013.01)

(58) Field of Classification Search
CPC .............................................. H01L 21/02104
USPC ................................................. 438/758, 792
See application file for complete search history.

(56) References Cited

U.S. PATENT DOCUMENTS

| 2004/0005723 | A1* | 1/2004 | Empedocles | ......... B81C 99/008 438/1 |
| 2014/0170858 | A1* | 6/2014 | Harada | ................. C23C 16/308 438/758 |
| 2014/0193983 | A1* | 7/2014 | LaVoie | .............. C23C 16/45529 438/778 |
| 2015/0007774 | A1* | 1/2015 | Iwasaki | ............. C23C 16/45542 118/723 R |
| 2015/0167163 | A1* | 6/2015 | Kubota | ............. H01L 21/02211 216/39 |

FOREIGN PATENT DOCUMENTS

JP       2014-135475 A     7/2014

* cited by examiner

*Primary Examiner* — Jami M Valentine
(74) *Attorney, Agent, or Firm* — Abelman, Frayne & Schwab

(57) ABSTRACT

Disclosed is a method of forming a nitride film on a substrate to be processed ("processing target substrate") in a processing container. The method includes an adsorption step of supplying a precursor gas including a silicon-containing gas into the processing container, and adsorbing a molecule of the precursor gas onto a surface of the processing target substrate, and a reaction step of supplying a reaction gas including a nitrogen- and hydrogen-containing gas while supplying microwaves from an antenna to generate plasma of the reaction gas just above the processing target substrate, and performing a plasma processing, by the generated plasma, on a surface of the substrate to be processed on which the molecule of the precursor gas has been adsorbed.

8 Claims, 10 Drawing Sheets

US 9,478,410 B2

METHOD OF FORMING NITRIDE FILM WITH PLASMA

CROSS-REFERENCE TO RELATED APPLICATIONS

This application is based on and claims priority from Japanese Patent Application No. 2014-253494 filed on Dec. 15, 2014 with the Japan Patent Office, the disclosure of which is incorporated herein in its entirety by reference.

TECHNICAL FIELD

Various aspects and exemplary embodiments of the present disclosure relate to a film forming method.

BACKGROUND

In a device such as, for example, a flash memory, information is stored as electrons or holes are stored in a floating gate through a tunnel insulating film at the time of writing or erasing. With an increase in capacity and density of the flash memory, a nitride film having a high dielectric constant, for example, a SiN film is used for the tunnel insulating film. A SiN film with reduced structural defects is formed by, for example, atomic layer deposition (ALD).

In the ALD method, a substrate is exposed to a precursor gas containing constituent elements of a thin film to be formed on the substrate so that the precursor gas is adsorbed onto the surface of the substrate. Subsequently, the substrate is exposed to a purge gas to remove the precursor gas excessively adsorbed onto the surface of the substrate. Then, high frequency waves are supplied to a reaction gas containing the constituent elements of the thin film to be formed, thereby generating plasma of the reaction gas, and the substrate is exposed to the generated plasma, thereby forming the desired thin film on the substrate. In the ALD method, a film containing atoms or molecules contained in the precursor gas is formed on the substrate by repeating such steps. See, for example, Japanese Patent Laid-Open Publication No. 2014-135475.

SUMMARY

According to an aspect, the present disclosure provides a method of forming a nitride film on a substrate to be processed ("processing target substrate") in a processing container. The method includes an adsorption process of supplying a precursor gas including a silicon-containing gas into the processing container, and adsorbing a molecule of the precursor gas onto a surface of the processing target substrate, and a reaction process of supplying a reaction gas including a nitrogen- and hydrogen-containing gas while supplying microwaves from an antenna to generate plasma of the reaction gas just above the processing target substrate, and performing a plasma processing, by the generated plasma, on a surface of the processing target substrate on which the molecule of the precursor gas has been adsorbed.

The foregoing summary is illustrative only and is not intended to be in any way limiting. In addition to the illustrative aspects, embodiments, and features described above, further aspects, embodiments, and features will become apparent by reference to the drawings and the following detailed description.

BREIF DESCRIPTION OF THE DRAWINGS

DETAILED DESCRIPION

Figure 1:
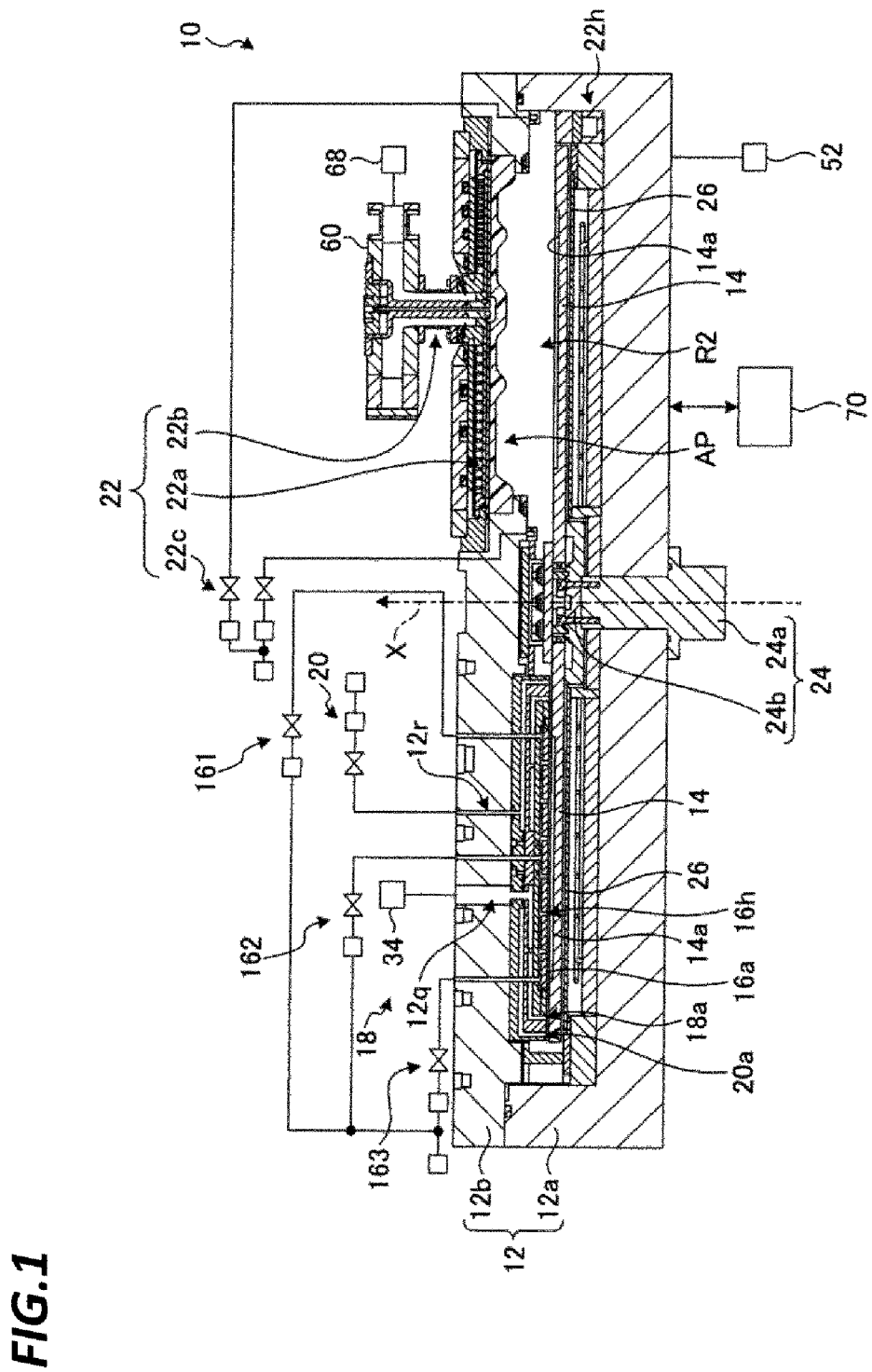
FIG. 1 is a cross-sectional view illustrating an exemplary film forming apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An insulating film such as, for example, a SiN film desirably has a low stress property in terms of a shape controllability in a fine processing. In addition, an insulating film having a high compressibility has a high electron mobility. Therefore, an insulating film having high compressibility is demanded in terms of an improvement in operation speed of a device using an insulating film. However, a SiN film formed by the ALD method using high frequency plasma has high extensibility. Thus, it is difficult to perform the fine processing as well as to enhance the electron mobility in the insulating film.

According to an aspect, the present disclosure provides a method of forming a nitride film on a processing target substrate in a processing container. The method includes an adsorption step of supplying a precursor gas including a silicon-containing gas into the processing container, and adsorbing a molecule of the precursor gas onto a surface of the processing target substrate, and a reaction step of supplying a reaction gas including a nitrogen- and hydrogen-containing gas while supplying microwaves from an antenna to generate plasma of the reaction gas just above the processing target substrate, and performing a plasma processing, by the generated plasma, on a surface of the processing target substrate on which the molecule of the precursor gas has been adsorbed.

In an exemplary embodiment of the above-mentioned method, the silicon-containing gas may include a gas containing a molecule having a Si—Cl bond.

In an exemplary embodiment of the above-mentioned method, the reaction gas may be a mixed gas of $NH_3$ gas and $H_2$ gas.

In an exemplary embodiment of the above-mentioned method, a flow rate of the $NH_3$ gas in the reaction gas may be higher than a flow rate of the $H_2$ gas.

In an exemplary embodiment of the above-mentioned method, the precursor gas may include no hydrogen-containing gas.

In an exemplary embodiment of the above-mentioned method, the precursor gas may include a hexachlorodisilane-containing gas.

In an exemplary embodiment of the above-mentioned method, the precursor gas may include $BCl_3$ gas.

In an exemplary embodiment of the above-mentioned method, a ratio of a flow rate of the $BCl_3$ gas to a flow rate of a sum of the silicon-containing gas and the $BCl_3$ gas may be 30% to 50%.

In an exemplary embodiment of the above-mentioned method, the processing container may be divided into a plurality of regions in a circumferential direction where the processing target substrate is moved around an axis by rotating a placing table on which the processing target substrate is placed, the placing table being provided to be rotatable around the axis such that the processing target substrate is moved around the axis. In the adsorption step, the precursor gas may be supplied to one region among the plurality of regions. In the reaction step, the reaction gas may be supplied to another region among the plurality of regions.

In an exemplary embodiment of the above-mentioned method, the reaction gas may be a mixed gas of $NH_3$ gas and $H_2$ gas. A rotation speed of the placing table may be 3 rpm to 10 rpm. Two or more antennae may be provided. A flow rate of the $NH_3$ gas may be 100 sccm to 750 sccm. A flow rate of the $H_2$ gas may be 4,300 sccm to 8,000 sccm.

According to various aspects and exemplary embodiments of the present disclosure, it is possible to provide a film that facilitates a fine processing, or a film that is excellent in electron mobility.

(Exemplary Embodiment)

Figure 2:
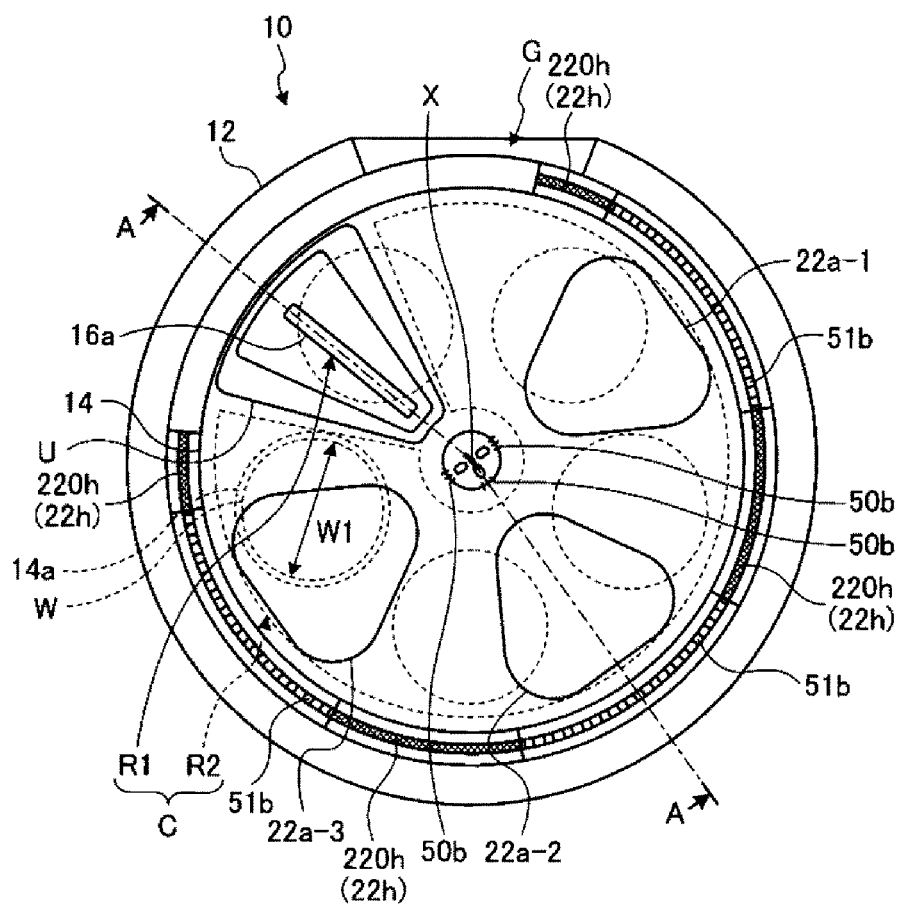
FIG. 2 is a schematic view illustrating the exemplary film forming apparatus when viewed from the top.
Figure 3:
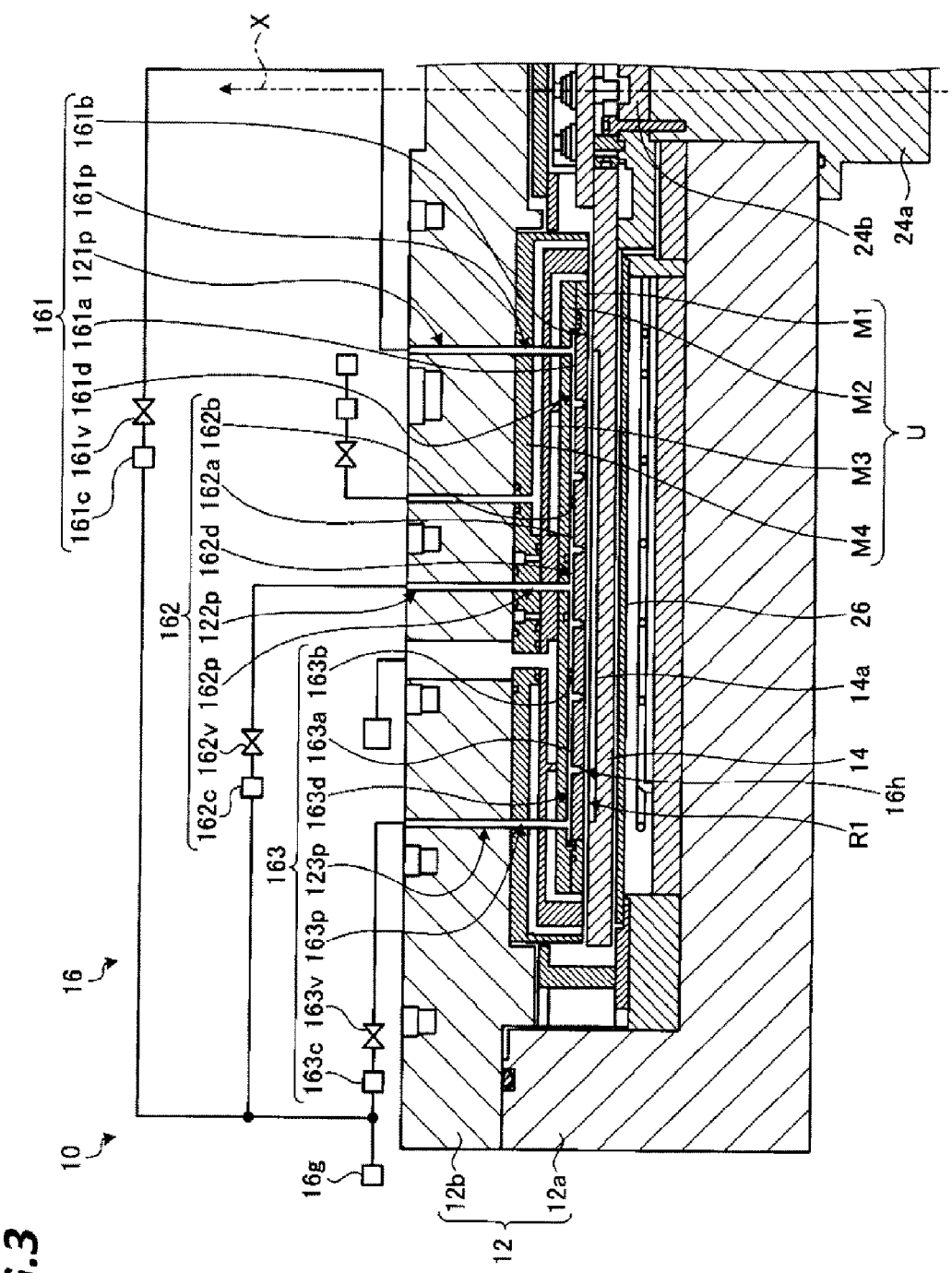
FIG. 3 is an enlarged cross-sectional view illustrating an example of a portion at the left side of an axis X in FIG. 1.
Figure 4:
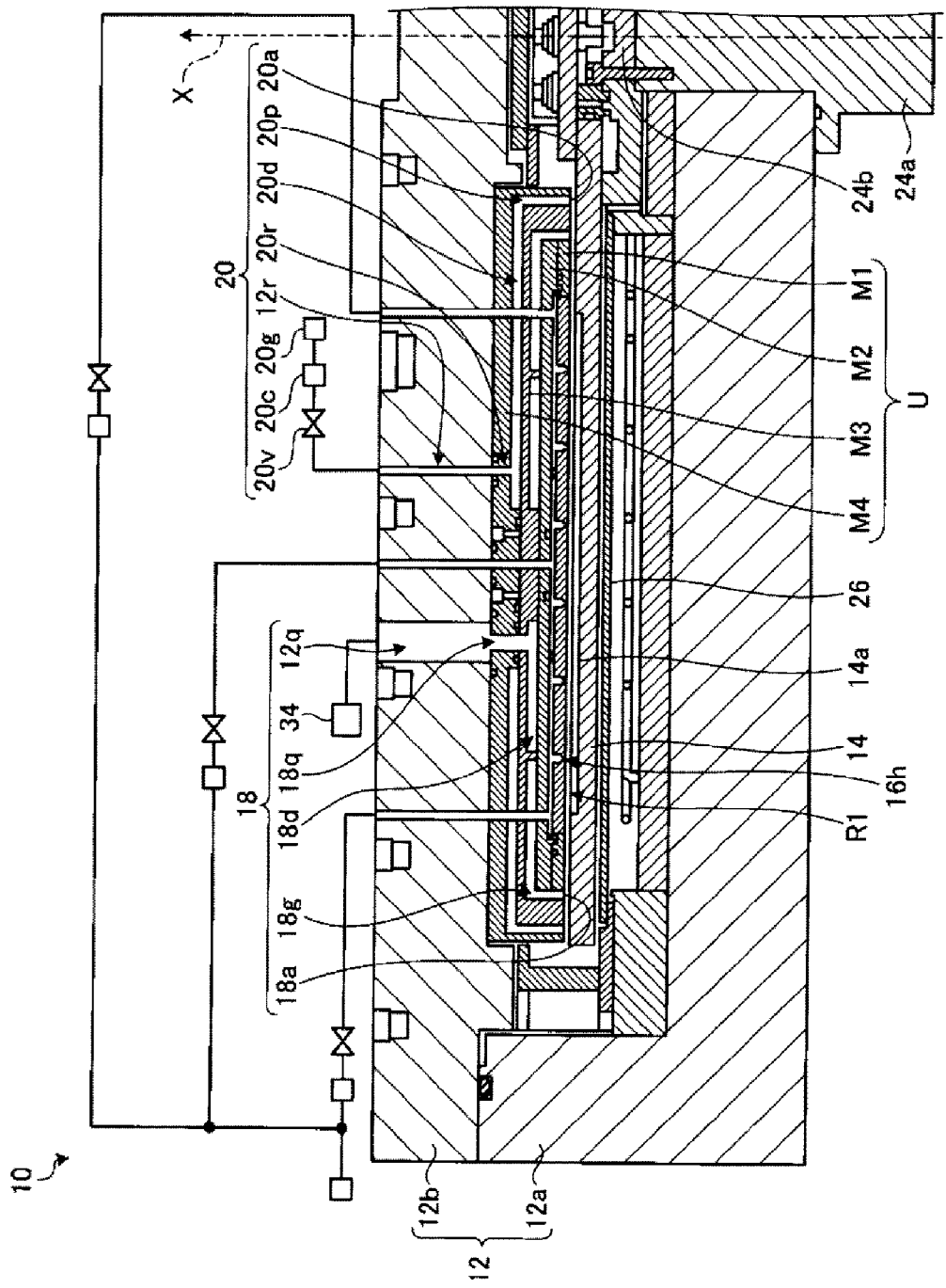
FIG. 4 is an enlarged cross-sectional view illustrating another example of the portion at the left side of the axis X in FIG. 1.
Figure 5:
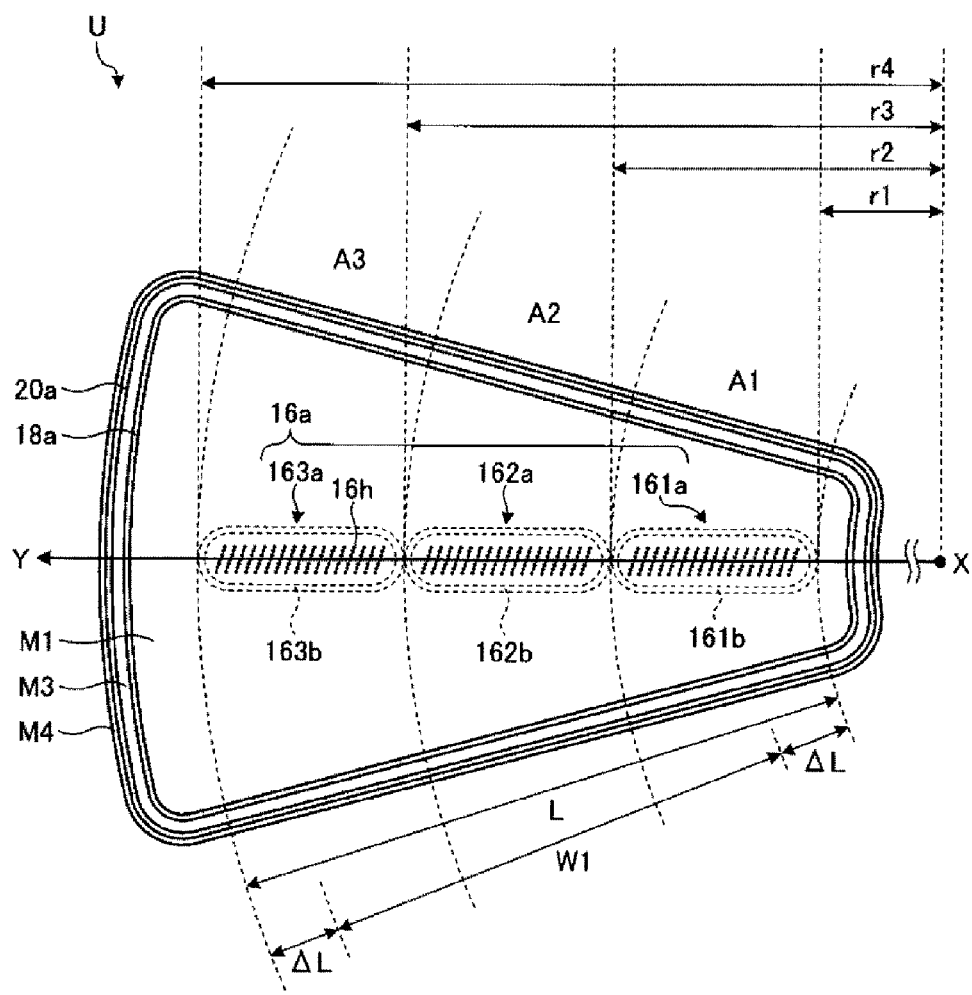
FIG. 5 is a view illustrating an example of a bottom surface of a unit U.
Figure 6:
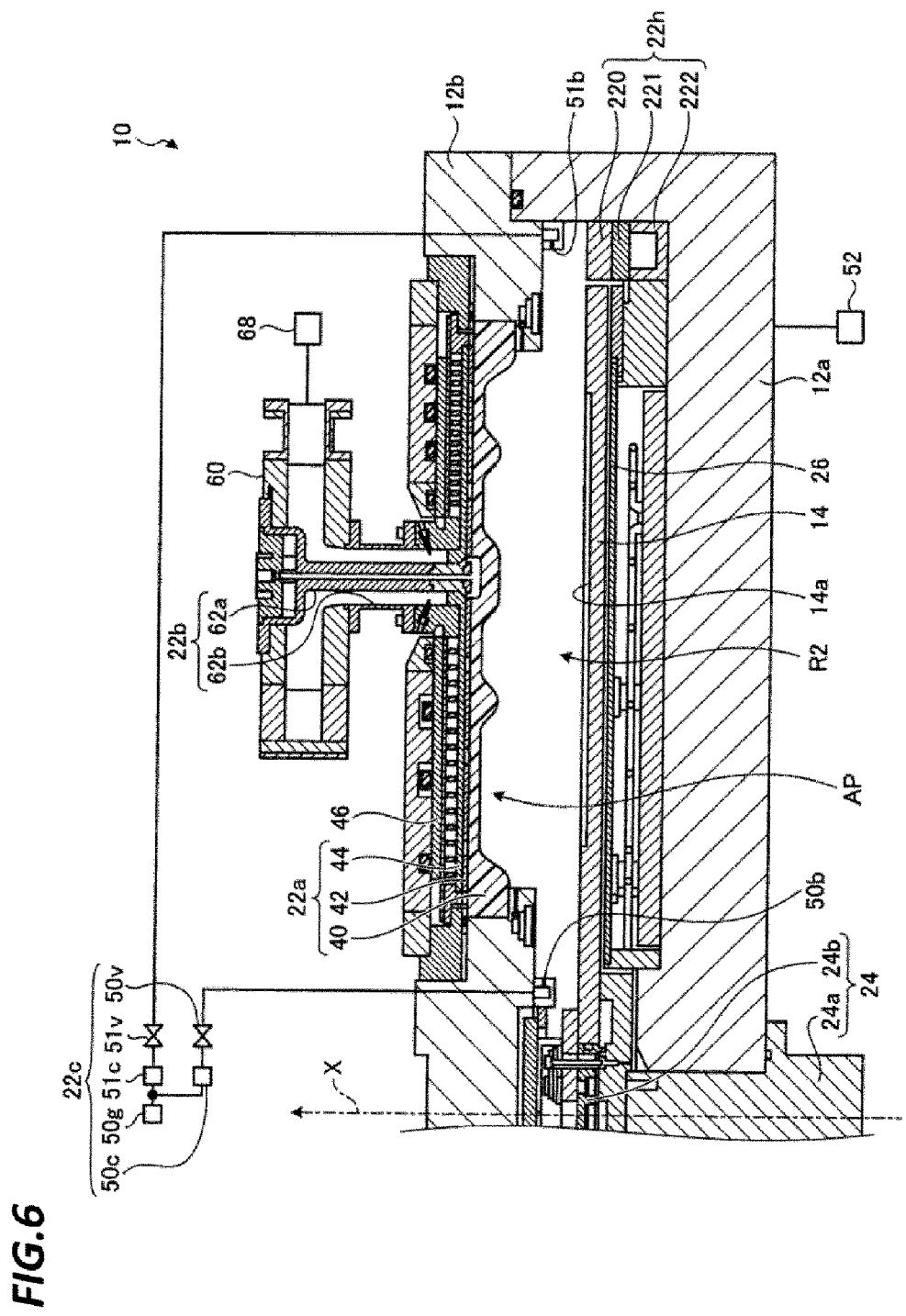
FIG. 6 is an enlarged cross-sectional view illustrating an example of a portion at the right side of the axis X in FIG. 1.

FIG. 1 is a cross-sectional view illustrating an exemplary film forming apparatus 10. FIG. 2 is a schematic view illustrating the film forming apparatus 10 when viewed from the top. A cross-section taken along line A-A in FIG. 2 corresponds to FIG. 1. FIGS. 3 and 4 are enlarged cross-sectional views illustrating an example of a portion at the left side of an axis X in FIG. 1. FIG. 5 is a view illustrating an example of a bottom surface of a unit U. FIG. 6 is an enlarged cross-sectional view illustrating an example of a portion at the right side of the axis X in FIG. 1. The film forming apparatus 10 includes, mainly, a processing container 12, a placing table 14, a first gas supply section 16, an exhaust section 18, a second gas supply section 20, and a plasma generating section 22.

As illustrated in FIG. 1, the processing container 12 is provided with a lower member 12a and an upper member 12b. The lower member 12a has a substantially cylindrical shape that is top-opened, and forms a recess including a sidewall and a bottom wall, which define a processing chamber C. The upper member 12b is a cover body having a substantially cylindrical shape, and defines the processing chamber C by covering the top opening of the recess of the lower member 12a. In an outer peripheral portion between the lower member 12a and the upper member 12b, an elastic sealing member, for example, an O-ring is provided to seal the processing chamber C.

The film forming apparatus 10 includes the placing table 14 inside the processing chamber C defined by the processing container 12. The placing table 14 is rotationally driven around an axis X by a driving mechanism 24. The driving mechanism 24 is provided with a driving device 24a such as, for example, a motor, and a rotation shaft 24b, and is attached to the lower member 12a of the processing container 12.

The rotation shaft 24b extends to the inside of the processing chamber C with the axis X as a central axis. The rotation shaft 24b is rotated around the axis X by a driving force transmitted from the driving device 22a. The central portion of the placing table 14 is supported by the rotation shaft 24b. Accordingly, the placing table 14 is rotated around the axis X as the rotation shaft 24b is rotated. Further, an elastic sealing member such as, for example, an O-ring is provided between the lower member 12a of the processing container 12 and the driving mechanism 24 to seal the processing chamber C.

The film forming apparatus 10 includes a heater 26 below the placing table 14 inside the processing chamber C to heat a substrate W, which is a processing target substrate, placed on the placing table 14. Specifically, the heater 26 heats the substrate W by heating the placing table 14.

For example, as illustrated in FIG. 2, the processing container 12 is a substantially cylindrical container with the axis X as a central axis, and includes the processing chamber C defined therein. The processing chamber C is provided with a unit U including an injection part 16a. The processing container 12 is formed of a metal such as, for example, aluminum (Al) the inner surface of which is subjected to, for example, an alumite treatment or a spray treatment of yttrium oxide ($Y_2O_3$). The film forming apparatus 10 includes a plurality of plasma generating sections 22 within the processing container 12.

Each plasma generating section 22 is provided with a plurality of antennae 22a-1 to 22a-3 that output microwaves, in an upper portion of the processing container 12. In the present exemplary embodiment, each antenna 22a has an external appearance of a substantially triangular shape with rounded corners. In FIG. 2, three antennae 22a-1 to 22a-3 are provided in the upper portion of the processing container 12. However, the number of the antennae 22a is not limited thereto, and may be two or less, or four or more.

For example, as illustrated in FIG. 2, the film forming apparatus 10 includes a placing table 14 provided with a plurality of substrate placing regions 14a on its top surface. The placing table 14 is a substantially disc-shaped member with the axis X as a central axis. On the top surface of the placing table 14, a plurality of (five in the example of FIG. 2) substrate placing regions 14a, on which the substrate W is placed, are formed concentrically around the axis X. The substrate W is disposed in a substrate placing region 14a, and the substrate placing region 14a supports the substrate such that the substrate is not dislocated when the placing table 14 is rotated. The substrate placing region 14a is a substantially circular recess, which is substantially the same shape as the substantially circular substrate W. The diameter of the recess of the substrate placing region 14a is substantially the same as the diameter W1 of the substrate W placed on the substrate placing region 14a. That is, the diameter of the recess of the substrate placing region 14a may be set such that the placed substrate W is fitted in the recess and the substrate W is fixed so as not to be moved from the fitted position by a centrifugal force even when the placing table 14 is rotated.

The film forming apparatus 10 includes a gate valve G at the outer periphery of the processing container 12. The gate valve G is configured to allow the substrate W to be carried into and out of the processing chamber C therethrough, using a conveyance device such as, for example, a robot arm. Further, the film forming apparatus 10 includes an exhaust section 22h along the peripheral edge of the placing table 14, below the outer periphery of the placing table 14. The exhaust section 22h is connected with an exhaust apparatus 52. The film forming apparatus 10 maintains the pressure within the processing chamber C at a target pressure by controlling the operation of the exhaust apparatus 52 to exhaust a gas in the processing chamber C from an exhaust port.

For example, as illustrated in FIG. 2, the processing chamber C includes a first region R1 and a second region R2 which are arranged on the circumference around the axis X. The substrate W placed on the substrate placing region 14a sequentially passes through the first region R1 and the second region R2 while the placing table 14 is rotated. In the present exemplary embodiment, the placing table 14 illustrated in FIG. 2 is rotated, for example, clockwise when viewed from the top.

For example, as illustrated in FIGS. 3 and 4, the first gas supply section 16 includes an inner gas supply section 161, an intermediate gas supply section 162, and an outer gas supply section 163. Further, for example, as illustrated in FIGS. 3 and 4, a unit U configured to perform supply, purge, and exhaust of gas is provided above the first region R1 to face the top surface of the placing table 14. The unit U has a structure in which a first member M1, a second member M2, a third member M3, and a fourth member M4 are sequentially stacked. The unit U is attached to the processing container 12 to abut onto the bottom surface of the upper member 12b of the processing container 12.

For example, as illustrated in FIGS. 3 and 4, the unit U includes a gas supply path 161p, a gas supply path 162p, and a gas supply path 163p, which pass through the second to fourth members M2 to M4. The upper end of the gas supply path 161p is connected to a gas supply path 121p provided in the upper member 12b of the processing container 12. The gas supply path 121p is connected with a gas supply source 16g of the precursor gas via a valve 161v and a flow rate controller 161c such as, for example, a mass flow controller. Further, the lower end of the gas supply path 161p is formed between the first member M1 and the second member M2, and connected to a buffer space 161d that is surrounded by an elastic member 161b such as, for example, an O-ring. The buffer space 161d is connected with an injection port 16h of an inner injection part 161a provided in the first member M1.

Further, the upper end of the gas supply path 162p is connected to a gas supply path 122p provided in the upper member 12b of the processing container 12. The gas supply path 122p is connected with the gas supply source 16g via a valve 162v and a flow rate controller 162c. Further, the lower end of the gas supply path 162p is formed between the first member M1 and the second member M2, and connected to a buffer space 162d that is surrounded by an elastic member 162b such as, for example, an O-ring. The buffer space 162d is connected with an injection port 16h of an intermediate injection part 162a provided in the first member M1.

Further, the upper end of the gas supply path 163p is connected to a gas supply path 123p provided in the upper member 12b of the processing container 12. The gas supply path 123p is connected with the gas supply source 16g via a valve 163v and a flow rate controller 163c. Further, the lower end of the gas supply path 163p is formed between the first member M1 and the second member M2, and connected to a buffer space 163d that is surrounded by an elastic member 163b such as, for example, an O-ring. The buffer space 163d is connected with an injection port 16h of an outer injection part 163a provided in the first member M1.

For example, as illustrated in FIGS. 3 and 4, the buffer space 161d of the inner gas supply section 161, the buffer space 162d of the intermediate gas supply section 162, and the buffer space 163d of the outer gas supply section 163 form an independent space, respectively. In addition, the flow rates of the precursor gas passing through the respective buffer spaces are independently controlled by the flow rate controller 161c, the flow rate controller 162c, and the flow rate controller 163c, respectively.

For example, as illustrated in FIGS. 3 and 4, the unit U includes a gas supply path 20r formed to penetrate through the fourth member M4. The upper end of the gas supply path 20r is connected to a gas supply path 12r provided in the upper member 12b of the processing container 12. The gas supply path 20r is connected with a gas supply source 20g of the purge gas via a valve 20v and a flow rate controller 20c.

The lower end of the gas supply path 20r is connected to a space 20d provided between the bottom surface of the fourth member M4 and the top surface of the third member M3. Further, the fourth member M4 includes a recess formed to accommodate the first to third members M1 to M3. A gap 20p is provided between the inner surface of the fourth member M4, which forms the recess, and the outer surface of the third member M3. The gap 20p is connected to the space 20d. The lower end of the gap 20p serves as an injection port 20a.

For example, as illustrated in FIGS. 3 and 4, the unit U includes an exhaust path 18q formed to penetrate through the third member M3 and the fourth member M4. The upper end of the exhaust path 18q is connected to an exhaust path 12q provided in the upper member 12b of the processing container 12. The exhaust path 12q is connected to the exhaust apparatus 34 such as, for example, a vacuum pump. Further, the exhaust path 18q is connected to a space 18d provided between the bottom surface of the third member M3 and the top surface of the second member M2.

The third member M3 is provided with a recess that accommodates the first member M1 and the second member M2. A gap 18g is provided between the inner surface of the third member M3, which constitutes the recess provided in the third member M3, and the outer surface of the second member M2. The space 18d is connected to the gap 18g. The lower end of the gap 18g serves as an exhaust port 18a.

For example, as illustrated in FIG. 5, the injection part 16a is provided along a Y-axis direction away from the axis X, on the bottom surface of the unit U, that is, a surface that faces the placing table 14. Among the regions included in the processing chamber C, the region that faces the injection part 16a corresponds to the first region R1. The injection part 16a injects the precursor gas toward the substrate W on the placing table 14. For example, as illustrated in FIG. 5, the injection part 16*a* includes an inner injection part 161*a*, an intermediate injection part 162*a*, and an outer injection part 163*a*.

For example, as illustrated in FIG. 5, the inner injection part 161*a* is formed in an inner annular region A1 that is a region included in the bottom surface of the unit U among annular regions where the distance from the axis X is in a range of r1 to r2. Further, the intermediate injection part 162*a* is formed in an intermediate annular region A2 that is a region included in the bottom surface of the unit U among annular regions where the distance from the axis X is in a range of r2 to r3. Further, the outer injection part 163*a* is formed in an outer annular region A3 that is a region included in the bottom surface of the unit U among annular regions where the distance from the axis X is in a range of r3 to r4.

For example, as illustrated in FIG. 5, a length L from r1 to r4, which is a range where the injection part 16*a* formed on the bottom surface of the unit U extends in the Y-axis direction, is a predetermined distance ΔL or more longer in the axis X side direction and the predetermined distance ΔL or more longer in a direction opposite to the axis X side than a distance where the substrate W of the diameter W1 passes through the Y-axis.

For example, as illustrated in FIG. 5, the inner injection part 161*a*, the intermediate injection part 162*a*, and the outer injection part 163*a* include a plurality of injection ports 16*h*. The precursor gas is injected to the first region R1 from the respective injection ports 16*h*. The flow rates of the precursor gas injected from the respective injection ports 16*h* of the inner injection part 161*a*, the intermediate injection part 162*a*, and the outer injection part 163*a* to the first region R1 are independently controlled by the flow rate controller 161*c*, the flow rate controller 162*c*, and the flow rate controller 163*c*, respectively. As the precursor gas is supplied to the first region R1, the atoms or molecules of the precursor gas are adsorbed onto the surface of the substrate W that has passed through the first region R1. A gas containing a molecule having a Si—Cl bond may be available for the precursor gas. As the gas containing a molecule having a Si—Cl bond, a gas such as, for example, dichlorosilane (DCS), monochlorosilane, trichlorosilane, hexachlorosilane, or silicon tetrachloride may be used. Besides, a silicon-containing gas such as, for example, monosilane ($SiH_4$) may be used for the precursor gas.

Above the first region R1, for example, as illustrated in FIGS. 3 and 4, an exhaust port 18*a* of the exhaust section 18 is provided to face the top surface of the placing table 14. For example, as illustrated in FIG. 5, the exhaust port 18*a* is formed in the bottom surface of the unit U to surround the injection part 16*a*. The exhaust section 18 exhausts a gas in the processing chamber C through the exhaust port 18*a* by the operation of the exhaust apparatus 34 such as, for example, a vacuum pump.

Above the first region R1, for example, as illustrated in FIGS. 3 and 4, an injection port 20*a* of the second gas supply section 20 is provided to face the top surface of the placing table 14. For example, as illustrated in FIG. 5, the injection port 20*a* is formed in the bottom surface of the unit U to surround the exhaust port 18*a*. The second gas supply section 20 injects the purge gas to the first region R1 through the injection port 20*a*. The purge gas injected by the second gas supply section 20 is an inert gas such as, for example, argon (Ar). As the purge gas is injected to the surface of the substrate W, atoms or molecules of the precursor gas that are excessively adsorbed onto the substrate W (residual gas components) are removed. Therefore, an atomic layer or molecular layer, in which the atoms or molecules of the precursor gas is adsorbed, is formed on the surface of the substrate W.

The unit U injects the purge gas from the injection port 20*a* and exhausts the purge gas from the exhaust port 18*a* along the surface of the placing table 14. Accordingly, the unit U suppresses the precursor gas supplied to the first region R1 from leaking out from the first region R1. Further, the unit U suppresses the reaction gas or the radicals of the reaction gas supplied to the second region R2 from entering into the first region R1 by injecting the purge gas from the injection port 20*a* and exhausting the purge gas from the exhaust port 18*a* along the surface of the placing table 14. That is, the unit U separates the first region R1 and the second region R2 by the injection of the purge gas from the second gas supply section 20 and the exhaust of the purge gas from the exhaust section 18.

For example, as illustrated in FIG. 6, the film forming apparatus 10 includes a plasma generating section 22 in an opening AP of the upper member 12*b* located above the second region R2. The plasma generating section 22 is provided to face the top surface of the placing table 14. The plasma generating section 22 includes an antenna 22*a*, a coaxial waveguide 22*b* that supplies microwaves to the antenna 22*a*, and a reaction gas supply section 22*c* that supplies the reaction gas to the second region R2. In the present exemplary embodiment, for example, three openings AP are formed in the upper member 12*b*, and the film forming apparatus 10 includes, for example, three antennae 22*a*-1 to 22*a*-3.

The plasma generating section 22 generates plasma of the reaction gas in the second region R2 by supplying microwaves from the antenna 22*a* and the coaxial waveguide 22*b* to the second region R2 and supplying the reaction gas from the reaction gas supply section 22*c* to the second region R2. Then, the plasma generating section 22 performs a plasma processing on the atomic layer or molecular layer adsorbed on the surface of the substrate W. In the present exemplary embodiment, a gas containing nitrogen atoms and hydrogen atoms is used as the reaction gas, and the plasma generating section 22 nitrifies the atomic layer or molecular layer adsorbed on the substrate W. The reaction gas may be, for example, a mixed gas of nitrogen ($N_2$) gas and hydrogen ($H_2$) gas, or a mixed gas of ammonia ($NH_3$) gas and $H_2$ gas.

For example, as illustrated in FIG. 6, in the plasma generating section 22, the antenna 22*a* is air-tightly arranged to close the opening AP. The antenna 22*a* includes a top plate 40, a slot plate 42, and a slow wave plate 44. The top plate 40 is a member in a substantially equilateral triangle shape with rounded corners, which is made of a dielectric such as, for example, alumina ceramics. The top plate 40 is supported by the upper member 12*b* such that its bottom surface is exposed from the opening AP formed in the upper member 12*b* of the processing container 12 to the second region R2.

The slot plate 42 is provided on the top surface of the top plate 40. The slot plate 42 is a plate-like metal member which is formed in a substantially equilateral triangle shape. The slot plates 42 includes a plurality of slot pairs. Each slot pair includes two slot holes that are orthogonal to each other.

The slow wave plate 44 is provided on the top surface of the slot plate 42. The slow wave plate 44 is formed of a dielectric such as, for example, alumina ceramics, in a substantially equilateral triangle shape. The slow wave plate 44 includes a substantially cylindrical opening to arrange an outer conductor 62*b* of the coaxial waveguide 22*b*.

A metal cooling plate 46 is provided on the top surface of the slow wave plate 44. The cooling plate 46 cools the antenna 22a by a coolant flowing through a flow path formed therein, through the slow wave plate 44. The cooling plate 46 is pressed against the top surface of the slow wave plate 44 by a spring (not illustrated), so that the bottom surface of the cooling plate 46 is in close contact with the top surface of the slow wave plate 44.

The coaxial waveguide 22b includes an inner conductor 62a and the outer conductor 62b. The inner conductor 62a penetrate through the opening of the slow wave plate 44 and the opening of the slot plate 42 from the upper side of the antenna 22a. The outer conductor 62b is provided to surround the inner conductor 62a with a gap between the outer peripheral surface of the inner conductor 62a and the inner peripheral surface of the outer conductor 62b. The lower end of the outer conductor 62b is connected to the opening of the cooling plate 46. Further, the antenna 22a may function as an electrode. Alternatively, an electrode provided in the processing container 12 may be used as the antenna 22a.

The film forming apparatus 10 includes a waveguide 60 and a microwave generator 68. The microwaves of, for example, about 2.45 GHz, which are generated by the microwave generator 68, are propagated to the coaxial waveguide 22b through the waveguide 60, and propagated through the gap between the inner conductor 62a and the outer conductor 62b. Then, the microwaves propagated into the slow wave plate 44 are propagated from the slot holes of the slot plate 42 to the top plate 40, and radiated from the top plate 40 to the second region R2.

In the second region R2, the reaction gas is supplied from the reaction gas supply section 22c. The reaction gas supply section 22c includes a plurality of inner injection ports 50b and a plurality of outer injection ports 51b, for example, as illustrated in FIG. 2. For example, as illustrated in FIG. 6, each inner injection port 50b is connected to a gas supply source 50g of the reaction gas via a valve 50v and a flow rate controller 50c such as, for example, a mass flow controller. For example, as illustrated in FIG. 6, each inner injection port 50b is provided in the bottom surface of the upper member 12b of the processing container 12.

Each inner injection port 50b injects the reaction gas, which is supplied from the gas supply source 50g through the valve 50v and the flow rate controller 50c, to the second region R2 below the antenna 22a in, for example, a direction parallel to the surface of the substrate W placed on the substrate placing region 14a of the placing table 14 as a direction far away from the axis X.

Each outer injection port 51b is connected to the gas supply source 50g of the reaction gas via a valve 51v and a flow rate controller 51c such as a mass flow controller. For example, as illustrated in FIG. 6, each outer injection port 51b is provided in the bottom surface of the upper member 12b of the processing container 12. Each outer injection port 51b injects the reaction gas, which is supplied from the gas supply source 50g through the valve 51v and the flow rate controller 51c, in, for example, a direction parallel to the surface of the substrate W placed on the substrate placing region 14a of the placing table 14 as a direction approaching the axis X.

Further, in the present exemplary embodiment, the flow rates of the reaction gas injected from the inner injection ports 50b and the outer injection ports 51b are independently controlled by the flow rate controller 50c and the flow rate controller 51c, respectively. Further, the flow rate controller 50c and the flow rate controller 51c may be provided in every antenna 22a, and the flow rates of the reaction gas injected from the inner injection ports 50b and the outer injection ports 51b may be independently controlled in every antenna 22a.

The plasma generating section 22 supplies the reaction gas to the second region R2 by the plurality of inner injection ports 50b and the plurality of outer injection ports 51b and radiates the microwaves to the second region R2 by the antenna 22a. Accordingly, the plasma generating section 22 generates the plasma of the reaction gas in the second region R2. Then, the substrate W, which is a processing target substrate, placed on the placing table 14 passes below the generated plasma of the reaction gas in the second region R2 by the rotation of the placing table 14. As such, as the plasma of the reaction gas containing hydrogen is generated just above the processing target substrate, it is possible to remove chlorine (Cl), which would be incorporated as an impurity into a nitride film, by the high-density hydrogen plasma. Therefore, a film having less impurity components may be formed on the processing target substrate. The film having less impurity components exhibits compressibility.

For example, as illustrated in FIG. 2, the exhaust section 22h is provided in the peripheral edge of the placing table 14. For example, as illustrated in FIG. 6, the exhaust section 22h includes a top-opened groove 222, and a cover 221 provided in the upper portion of the groove 222. The groove 222 is connected to the exhaust apparatus 52. For example, as illustrated in FIG. 2, the cover 221 includes a plurality of exhaust holes in exhaust regions 220h.

Further, a spacer 220 is provided on the cover 221 below the outer injection ports 51b. For example, as illustrated in FIG. 6, the spacer 220 has a thickness that is substantially the same as the height from the top surface of the cover 221 to the top surface of the placing table 14. The spacer 220 suppresses increase in flow speed of the gas caused by a difference in level between the placing table 14 and the cover 221, below the outer injection ports 51b.

In the respective exhaust region 220h, the exhaust section 22h exhausts the gas in the processing chamber C from the plurality of exhaust holes provided in the cover 221 through the groove 222 by the operation of the exhaust apparatus 52. In addition, as for the exhaust holes provided in the cover 221, the position, size, and number of the exhaust holes provided in the respective exhaust regions 220h are adjusted such that the exhaust amounts from the respective exhaust regions become substantially equal.

For example, as illustrated in FIG. 1, the film forming apparatus 10 includes a controller configured to control respective components of the film forming apparatus 10. The controller 70 may be a computer including a control device such as a central processing unit (CPU), a storage device such as a memory, and an input/output device. The controller 70 controls the respective components of the film forming apparatus 10 by the operation of the CPU according to a control program stored in the memory.

The controller 70 transmits a control signal that controls the rotation speed of the placing table 14, to the driving device 24a. Further, the controller 70 transmits a control signal that controls the temperature of the substrate W, to a power source connected to the heater 26. Further, the controller 70 transmits a control signal that controls the flow rate of the precursor gas, to the valves 161v to 163v and the flow rate controllers 161c to 163c. Further, the controller 70 transmits a control signal that controls the exhaust amount of the exhaust apparatus 34 connected to the exhaust port 18a, to the exhaust apparatus 34.

Further, the controller 70 transmits a control signal that controls the flow rate of the purge gas, to the valve 20v and the flow rate controller 20c. Further, the controller 70 transmits a control signal that controls the transmission power of the microwaves, to the microwave generator 68. Further, the controller 70 transmits a control signal that controls the flow rate of the reaction gas, to the valve 50v, the valve 51v, the flow rate controller 50c, and the flow rate controller 51c. Further, the controller 70 transmits a control signal that controls the exhaust amount from the exhaust section 22h, to the exhaust apparatus 52.

By the film forming apparatus 10 configured as described above, the precursor gas from the first gas supply section 16 is injected onto the substrate W that is moving by the rotation of the placing table 14, and an excessively adsorbed precursor gas is removed from the substrate W by the second gas supply section 20. Then, the substrate W that is moving by the rotation of the placing table 14 is exposed to the plasma of the reaction gas, which is generated by the plasma generating section 22. As the above-described operations are performed repeatedly on the substrate W by the rotation of the placing table 14, the film forming apparatus 10 forms a film having a predetermined thickness on the substrate W.

Example 1

In the following, the film forming apparatus 10 described with reference to FIGS. 1 to 6 was used to form a SiN film as a nitride film on a substrate W such as, for example, a silicon substrate, and a test was performed to measure the stress of the formed SiN film. First, the test was performed while varying the rotation speed of the placing table 14 to measure the stress of the SiN film. In the test, the flow rates of $NH_3$ gas and the flow rate of $H_2$ gas supplied to the second region R2 were set to 750 sccm and 4,300 sccm, respectively, and microwaves were supplied from the antennae 22a-2 to 22a-3 to the second region R2. Meanwhile, the antenna 22a-1 was not used. Further, the temperature of the substrate W in the plasma processing was 500° C., and DCS gas was used for the precursor gas.

Figure 7:
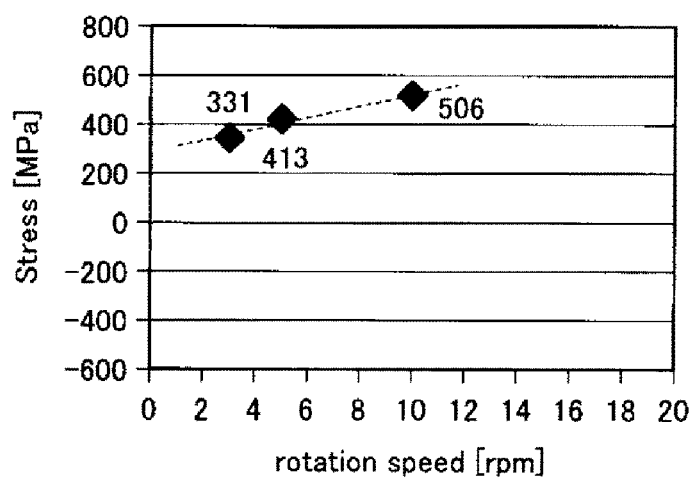
FIG. 7 is a graph illustrating an exemplary measurement result of a stress of a SiN film when a rotation speed of a placing table is changed.

FIG. 7 is a graph illustrating an exemplary measurement result of the stress of the SiN film when the rotation speed of the placing table 14 is changed. As illustrated in FIG. 7, when the rotation speed of the placing table 14 was 10 rpm, the stress of the SiN film was +506 MPa (tensile). Further, when the rotation speed of the placing table 14 was 5 rpm, the stress of the SiN film was +413 MPa (tensile). Further, when the rotation speed of the placing table 14 was 3 rpm, the stress of the SiN film was +331 MPa (tensile).

From the measurement result illustrated in FIG. 7, it has been found that the tensile stress in the SiN film tends to be decreased as the rotation speed of the placing table 14 is decreased. As for the reason, it is considered that the period of time for which the substrate W having molecules of the DCS gas adsorbed onto its surface was exposed to the plasma of the $NH_3$ gas and the $H_2$ gas was increased as the rotation speed of the placing table 14 was decreased. Therefore, it is considered that a SiN film having less impurities and high film density was formed because more impurities such as chlorine atoms and hydrogen atoms were released from the SiN film.

Figure 8:
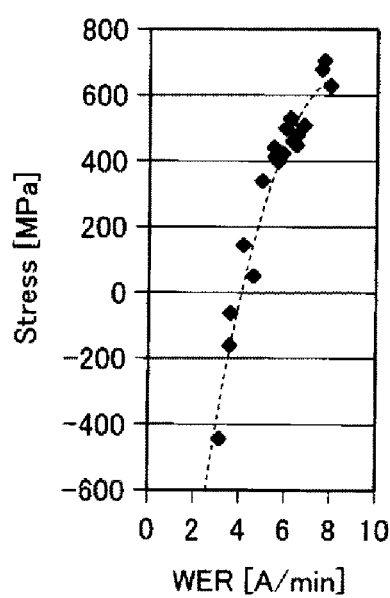
FIG. 8 is a graph illustrating an exemplary relationship between a WER and a stress of the SiN film formed using a film forming apparatus of the present exemplary embodiment.

FIG. 8 is a graph illustrating an exemplary relationship between a wet etching rate (WER) and the stress of the SiN film formed using the film forming apparatus 10 of the present exemplary embodiment. The WER refers to an etching rate by diluted hydrofluoric acid (DHF), which is measured by immersing a test sample in DHF in a predetermined concentration for a predetermined period of time. As the value of the WER is smaller, the etching resistance is higher and the film density is higher.

Referring to FIG. 8, it is understood that, as the tensile stress in the SiN film is decreased or the compressive stress is increased, the WER of the SiN film is decreased, that is, the film density is increased. The increase in film density is equivalent to the increase in compressive stress. Further, when the density of the SiN film is increased, an interatomic distance in the SiN film is decreased, and the electron mobility is increased.

Here, when the rotation speed of the placing table 14 is decreased, the film forming speed of the SiN film is also decreased, so that the productivity is decreased. Thus, in order to maintain a certain productivity while decreasing the tensile stress of the SiN film or increasing the compressive stress, the rotation speed of the placing table 14 may be in a range of, for example, 3 rpm to 100 rpm.

Figure 9:
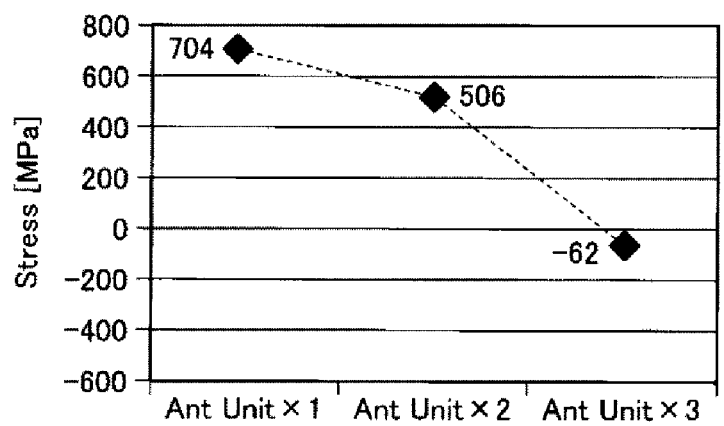
FIG. 9 is a graph illustrating an exemplary measurement result of a stress of the SiN film when the number of antennae supplying microwaves is changed.

Next, the number of the antennae 22a supplying microwaves was changed, and a test was performed to measure the stress of the SiN film. In the test, the rotation speed of the placing table 14 was set to 10 rpm. Further, in the test, the temperature of the substrate W, the kind of the precursor gas, and the flow rates of the $NH_3$ gas and the $H_2$ gas were the same as those in the test illustrated in FIG. 7. FIG. 9 is a graph illustrating an exemplary measurement result of the stress of the SiN film when the number of the antennae 22a supplying microwaves is changed.

Further, in the present exemplary embodiment, the film forming apparatus 10 includes three antennae 22a-1 to 22a-3. However, in the test illustrated in FIG. 9, in a case where two antennae 22a are used, the antenna 22a-1 arranged adjacent to the unit U in the rotation direction of the placing table 14 is not used, but the antenna 22a-2 and the antenna 22a-3 arranged closer to the downstream side in the rotation direction of the placing table 14 are used. Further, in the test illustrated in FIG. 9, in a case where one antenna 22a is used, the antennae 22a-1 and 22a-2 are not used, but the antenna 22a-3 is used.

As illustrated in FIG. 9, when the number of antennae 22a was 1, the stress of the SiN film was +704 MPa (tensile). Further, when the number of antennae 22a was 2, the stress of the SiN film was +506 MPa (tensile). Further, when the number of antennae 22a was 3, the stress of the SiN film was −62 MPa (compressive).

From the measurement result illustrated in FIG. 9, it is understood that, as the number of antennae 22a is increased, the tensile stress of the SiN film is decreased, and when the number of antennae 22a is 3, the stress of the SiN film becomes compressive. As for the reason, it is considered that, when the number of antennae 22a is increased, the power of the supplied microwaves is increased, and dissociation of atoms of the $NH_3$ gas and the $H_2$ gas proceeds. Thus, it is considered that, by the ions or radicals of the $NH_3$ gas and the $H_2$ gas, a reaction rate on the surface of the substrate W on which the atoms of the DCS gas was adsorbed was increased, more impurities such as chlorine atoms and hydrogen atoms in the SiN film were released, and thus, the SiN film was formed with high film density. Further, it is considered that as the film density was increased, the stress of the SiN film tended to exhibit the compressibility.

Further, in the measurement result of FIG. 9, when the number of antennae 22a was 3, the stress of the SiN film was low and exhibited a compressive property. Therefore, in terms of the enhancement in shape controllability in miniaturization or enhancement in electron mobility in the SiN film, the number of antennae 22a may be three (3) in the measurement result illustrated in FIG. 9. However, in terms of power consumption reduction in the process, if the stress of the SiN film can be reduced under other conditions, the number of antennae 22a may be two (2).

Figure 10:
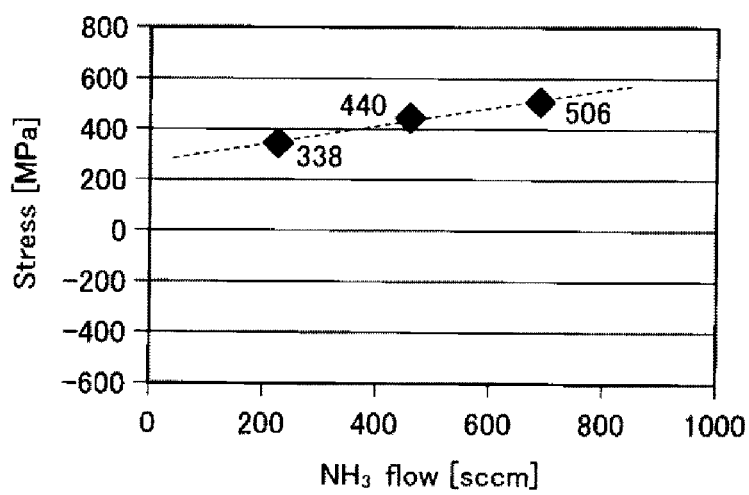
FIG. 10 is a graph illustrating an exemplary measurement result of a stress of the SiN film when a flow rate of $NH_3$ gas is changed.

Next, the flow rate of the $NH_3$ gas was changed, and a test was performed to measure the stress of the SiN film. In the test, the rotation speed of the placing table 14 was set to 10 rpm, and two antennae 22a-2 and 22a-3 were used. Further, in the test, the temperature of the substrate W, the kind of the precursor gas, and the flow rate of $H_2$ gas were the same as those in the test illustrated in FIG. 7. FIG. 10 is a graph illustrating an exemplary measurement result of the stress of the SiN film when the flow rate of the $NH_3$ gas is changed.

As illustrated in FIG. 10, when the flow rate of the $NH_3$ gas was 250 sccm, the stress of the SiN film was +338 MPa (tensile). Further, when the flow rate of the $NH_3$ gas was 500 sccm, the stress of the SiN film was +440 MPa (tensile). Further, when the flow rate of the $NH_3$ gas was 750 sccm, the stress of the SiN film was +506 MPa (tensile).

From the measurement result illustrated in FIG. 10, it is understood that, as the flow rate of the $NH_3$ gas is decreased, the tensile stress in the SiN film is decreased. As for the reason, it is considered that, as the flow rate of the $NH_3$ gas is decreased, $NH_3$ is sufficiently dissociated in the plasma, so that a ratio in which the nitrogen atoms and the hydrogen atoms are incorporated into the SiN film in a state of N—H bond is decreased. Therefore, it is considered that the concentration of the hydrogen atoms in the SiN film is decreased, and thus, the SiN film is formed with high film density.

Here, when the flow rate of the $NH_3$ gas is decreased, the film forming speed of the SiN film is also decreased, so that the productivity is decreased. Thus, in order to maintain a certain productivity while decreasing the tensile stress of the SiN film, the flow rate of the $NH_3$ gas may be in a range of, for example, 100 sccm to 2,300 sccm, more preferably in a range of 100 sccm to 750 sccm.

Figure 11:
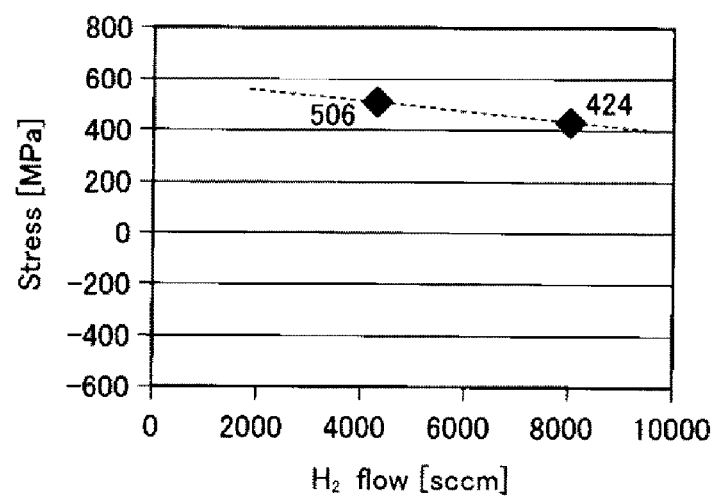
FIG. 11 is a graph illustrating an exemplary measurement result of a stress of the SiN film when a flow rate of $H_2$ gas is changed.

Next, the flow rate of the $H_2$ gas was changed, and a test was performed to measure the stress of the SiN film. In the test, the rotation speed of the placing table 14 was set to 10 rpm, and two antennae 22a-2 and 22a-3 were used. Further, in the test, the temperature of the substrate W, the kind of the precursor gas, and the flow rate of $NH_3$ gas were the same as those in the test illustrated in FIG. 7. FIG. 11 is a graph illustrating an exemplary measurement result of the stress of the SiN film when the flow rate of the $H_2$ gas is changed.

As illustrated in FIG. 11, when the flow rate of the $H_2$ gas was 4,300 sccm, the stress of the SiN film was +506 MPa (tensile). Further, when the flow rate of the $H_2$ gas was 8,000 sccm, the stress of the SiN film was +424 MPa (tensile).

From the measurement result illustrated in FIG. 11, it is understood that, as the flow rate of the $H_2$ gas is increased, the tensile stress in the SiN film is decreased. As for the reason, it is considered that, as the flow rate of the $H_2$ gas is increased, a ratio in which the chlorine atoms leave as HCl gas from the surface of the substrate W on which the elements of the DSC gas are adsorbed is increased. Therefore, it is considered that the concentration of the chlorine atoms in the SiN film is decreased, and thus, the SiN film is formed with high film density. However, when the flow rate of the $H_2$ gas is increased, the cost for gas is also increased. Thus, in terms of suppressing the increase in cost, the flow rate of the $H_2$ gas may be in a range of 1,500 sccm to 8,000 sccm, or in a range of 4,300 sccm to 8,000 sccm. In addition, the flow rate of the $H_2$ gas may be higher than the flow rate of the $NH_3$ gas.

Figure 12:
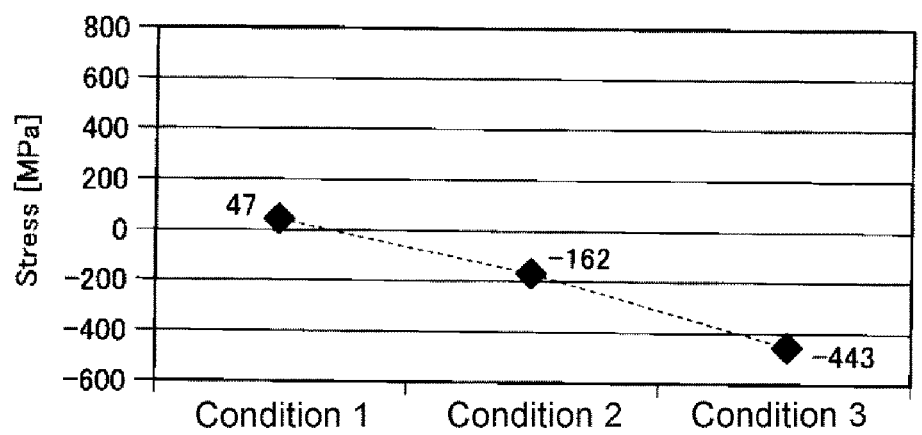
FIG. 12 is a graph illustrating an exemplary relationship between a film forming condition and a stress of the SiN film.

Next, from the tendency of the measurement results illustrated in FIGS. 7, 9, 10, and 11, several conditions that decrease the stress of the SiN film or increase the stress in a compressive direction, have been reviewed. FIG. 12 is a graph illustrating an exemplary relationship between a film forming condition and a stress of the SiN film.

In FIG. 12, Condition 1 is a film condition in which two antennae 22a (the antenna 22a-2 and the antenna 22a-3) were used, the flow rate of the $NH_3$ gas was set to 100 sccm, the flow rate of the $H_2$ gas was set to 8,000 sccm, and the rotation speed of the placing table 14 was set to 10 rpm. Further, Condition 2 is a film condition in which three antennae 22a were used, the flow rate of the $NH_3$ gas was set to 100 sccm, the flow rate of the $H_2$ gas was set to 8,000 sccm, and the rotation speed of the placing table 14 was set to 10 rpm. Further, Condition 3 is a film condition in which three antennae 22a were used, the flow rate of the $NH_3$ gas was set to 100 sccm, the flow rate of the $H_2$ gas was set to 8,000 sccm, and the rotation speed of the placing table 14 was set to 3 rpm. Further, in all the cases, the temperature of the substrate W was 500° C. in the plasma processing, and DSC gas was used for the precursor gas.

As illustrated in FIG. 12, in the case of Condition 1, the stress of the SiN film was +47 MPa (tensile). Further, in the case of Condition 2, the stress of the SiN film was −162 MPa (compressive). Further, in the case of Condition 3, the stress of the SiN film was −443 MPa (compressive).

Referring to FIG. 12, under Condition 1, the stress of the SiN film has a value close to zero (0). Thus, when a SiN film is formed under Condition 1, the film forming apparatus 10 may provide a SiN film that is easy to control the shape in a fine processing.

Further, under Condition 3, the stress of the SiN film is highly compressive. Thus, when a SiN film is formed under Condition 3, the SiN film may be formed with high film density. As the film density is increased, the interatomic distance is decreased, and the electron mobility is increased. Therefore, when a SiN film is formed under Condition 3, the film forming apparatus 10 may provide a SiN film having high electron mobility.

As such, Example 1 has been described. By controlling the rotation speed of the placing table 14, the number of the antennae 22a, the flow rate of the $NH_3$ gas, and the flow rate of the $H_2$ gas, the film forming apparatus 10 in the present example may provide a SiN film having less stress, or a SiN film having high compressive stress. Specifically, when a SiN film is formed under Condition 1, the film forming apparatus 10 in the present example may provide a SiN film that is easy to control the shape in a fine processing. Further, when a SiN film is formed under Condition 3, the film forming apparatus 10 in the present example may provide a SiN film having high electron mobility.

Example 2

The present example is different from Example 1 in that hexachlorodisilane is used as the precursor gas in place of the DCS gas to form a SiN film. In the following, the film forming apparatus 10 described with reference to FIGS. 1 to 6 was used to form a SiN film as a nitride film on a substrate W such as, for example, a silicon substrate, and a test was performed to measure a stress of the formed SiN film.

Figure 13:
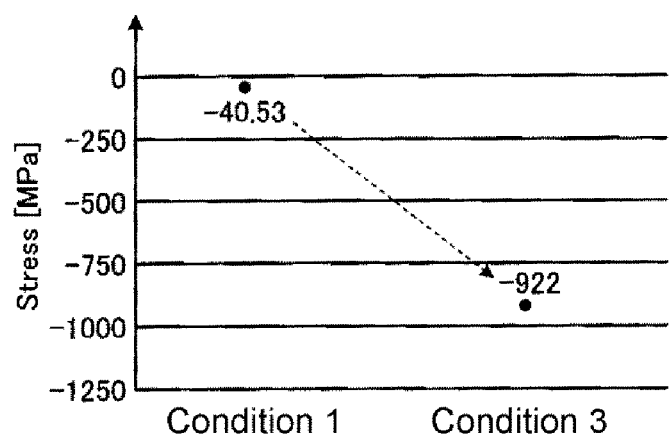
FIG. 13 is a graph illustrating an exemplary relationship between a film forming condition and a stress of the SiN film when hexachlorodisilane gas is used for the precursor gas.

FIG. 13 is a graph illustrating an exemplary relationship between a film forming condition and a stress of the SiN film when the hexachlorodisilane gas is used for the precursor gas. Condition 1 and Condition 3 illustrated in FIG. 13 are the same as Condition 1 and Condition 3 illustrated in FIG.

12 except that the hexachlorodisilane gas was used as the precursor gas in place of the DCS gas.

As illustrated in FIG. 13, in the case of Condition 1, the stress of the SiN film was −40.53 MPa (compressive). Further, in the case of Condition 3, the stress of the SiN film was −922 MPa (compressive). When the hexachlorodisilane gas was used for the precursor gas, in both cases of Condition 1 and Condition 3, the stress of the SiN film was increased in the compressive direction, as compared with the case where the DCS gas was used for the precursor gas (see FIG. 12).

The hexachlorodisilane gas contains no hydrogen atom. Therefore, it is considered that, as the substrate W on which the elements of the hexachlorodisilane gas are adsorbed is exposed to plasma of the $NH_3$ gas and the $H_2$ gas, the chlorine atoms leave as HCl gas from the surface of the substrate W, so that the SiN film is formed with high film density. Accordingly, it is considered that the stress of the SiN film exhibited a high compressive property.

As is evident from the measurement result of FIG. 13, when the hexachlorodisilane gas is used as the precursor gas, the film forming apparatus 10 may provide a SiN film having higher compressibility, as compared with the case where the DCS gas is used for the precursor gas. Accordingly, the film forming apparatus 10 may provide a SiN film having higher electron mobility.

Example 3

The present example is different from Examples 1 and 2 in that a mixed gas of the DCS gas and a boron atom-containing gas is used as the precursor gas to form a nitride film. In the present example, $BCl_3$ gas was used as the boron atom-containing gas. In the following, the film forming apparatus 10 described with reference to FIGS. 1 to 6 was used to form a nitride film on a substrate W such as, for example, a silicon substrate, and a test was performed to measure a stress of the formed nitride film.

Figure 14:
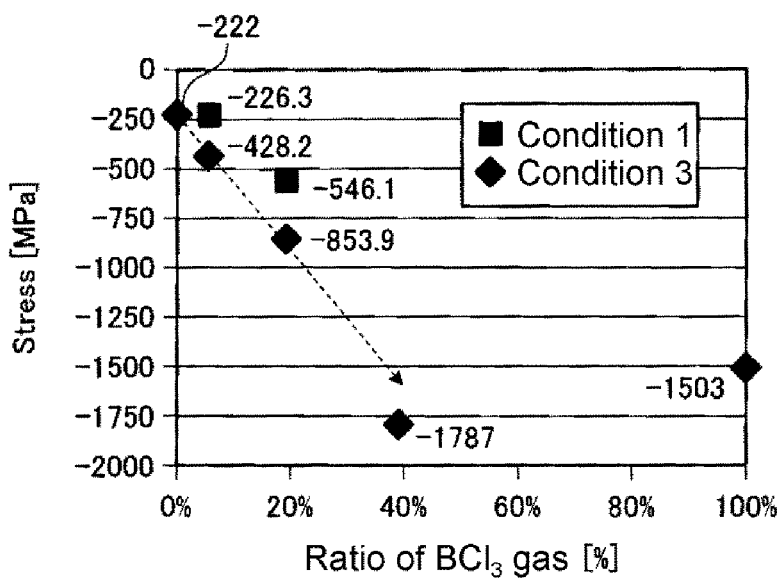
FIG. 14 is a graph illustrating an exemplary relationship between a film forming condition and a stress of the SiN film when a mixed gas of DCS gas and $BCl_3$ gas is used for the precursor gas.

FIG. 14 is a graph illustrating an exemplary relationship between a film forming condition and a stress of the SiN film when a mixed gas of the DCS gas and the $BCl_3$ gas is used for the precursor gas. The horizontal axis of FIG. 14 represents a ratio of the flow rate of the $BCl_3$ gas to a sum of the flow rates of the DCS gas and the $BCl_3$ gas. Condition 1 and Condition 3 illustrated in FIG. 14 are the same as Condition 1 and Condition 3 illustrated in FIG. 12 except that the mixed gas of the DCS gas and the $BCl_3$ gas was used as the precursor gas.

As illustrated in FIG. 14, in both cases of Condition 1 and Condition 3, as the ratio of the $BCl_3$ gas is increased, the stress of the nitride film tended to increase in the compressive direction. Further, as illustrated in FIG. 14, the nitride film formed under Condition 3 tended to have a higher compressive property than that of the nitride film formed under Condition 1. In addition, under Condition 3, when the ratio of the $BCl_3$ gas was set to 39%, the stress of the nitride film was −1,787 MPa. Further, in a case where the ratio of the $BCl_3$ gas was changed around 40%, it has been found that, when the ratio of the $BCl_3$ gas was 30% to 50%, the stress of the nitride film was increased up to about −1.8 GPa in the compression direction.

Further, as analyzed for composition of the formed nitride film using X-ray photoelectron spectroscopy (XPS), under Condition 3, the nitride film formed by setting the ratio of the $BCl_3$ gas to 0% contained about 40% of silicon atoms. Meanwhile, under Condition 3, the nitride film formed by setting the ratio of the $BCl_3$ gas to 39% contained about 2% of silicon atoms and about 40% of boron atoms. From the analysis result, it is considered that, when the $BCl_3$ gas is added to the DCS gas, the ratio of silicon atoms contained in the formed nitride film is decreased, and the reduced silicon atoms are replaced with boron atoms.

As is evident from the measurement result of FIG. 14, when a mixed gas of the DCS gas and the boron atom-containing gas is used as the precursor gas, the film forming apparatus 10 may provide a nitride film having a higher compressive property, as compared with the case of using a precursor gas that does not contain a boron-containing gas. In addition, by controlling the ratio of the $BCl_3$ gas in the mixed gas within a range of, for example, 30% to 50%, the stress of the nitride film may be increased up to about −1.8 GPa in the compression direction.

An exemplary embodiment has been described. The present disclosure is not limited to the exemplary embodiment described above, but various modifications may be made within the scope of the present disclosure.

For example, in the exemplary embodiment described above, a film forming apparatus 10 was described with respect to the semi-batch type film forming apparatus 10 described with reference to FIGS. 1 to 6, but the present disclosure is not limited thereto. The present disclosure may also be applied to, for example, a single wafer type or batch type film forming apparatus so long as it is a film forming apparatus of the ALD method using plasma of microwaves.

Further, in Example 2 described above, hexachlorodisilane gas was used as the precursor gas to form a SiN film, and in Example 3 described above, a mixed gas of DCS gas and a boron atom-containing gas was used as the precursor gas to form a nitride film. However, the present disclosure is not limited thereto. For example, a mixed gas of hexachlorodisilane gas and a boron atom-containing gas (e.g., $BCl_3$ gas) may be used to form a nitride film. In this case, when a ratio of the flow rate of the $BCl_3$ gas to a sum of the flow rates of the silicon-containing gas and the $BCl_3$ gas is 30% to 50%, the stress of the formed nitride film may be increased in the compression direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of forming a nitride film on a substrate to be processed ("processing target substrate") in a processing container, the method comprising:
   an adsorption step of supplying a precursor gas including a silicon-containing gas into the processing container, and adsorbing a molecule of the precursor gas onto a surface of the processing target substrate, and
   a reaction step of supplying a reaction gas including a nitrogen- and hydrogen-containing gas while supplying microwaves from an antenna to generate plasma of the reaction gas just above the processing target substrate, and performing a plasma processing, by the generated plasma, on a surface of the processing target substrate on which the molecule of the precursor gas is adsorbed,
   wherein the reaction gas is a mixed gas of $NH_3$ gas and $H_2$ gas, and a flow rate of the $NH_3$ gas in the reaction gas is higher than a flow rate of the $H_2$ gas.

2. The method of claim 1, wherein the silicon-containing gas includes a gas containing a molecule having a Si—Cl bond.

3. The method of claim 1, wherein the precursor gas includes no hydrogen-containing gas.

4. The method of claim 1, wherein the precursor gas includes a hexachlorodisilane-containing gas.

5. The method of claim 1, wherein the precursor gas includes $BCl_3$ gas.

6. The method of claim 5, wherein a ratio of a flow rate of the $BCl_3$ gas to a flow rate of a sum of the silicon-containing gas and the $BCl_3$ gas is 30% to 50%.

7. The method of claim 1, wherein the processing container is divided into a plurality of regions in a circumferential direction where the processing target substrate is moved around an axis by rotating a placing table on which the substrate to be processed is placed, the placing table being provided to be rotatable around the axis such that the processing target substrate is moved around the axis,
  in the adsorption step, the precursor gas is supplied to one region among the plurality of regions, and
  in the reaction step, the reaction gas is supplied to another region among the plurality of regions.

8. The method of claim 7, wherein the reaction gas is a mixed gas of $NH_3$ gas and $H_2$ gas,
  a rotation speed of the placing table is 3 rpm to 10 rpm,
  two or three antennas are provided,
  a flow rate of the $NH_3$ gas is 100 sccm to 750 sccm, and
  a flow rate of the $H_2$ gas is 4,300 sccm to 8,000 sccm.

* * * * *